(12) United States Patent
Kodama (10) Patent No.: US 10,475,777 B2
(45) Date of Patent: Nov. 12, 2019

(54) SEMICONDUCTOR APPARATUS INSTALLING PASSIVE DEVICE

(71) Applicant: SUMITOMO ELECTRIC DEVICE INNOVATIONS, INC., Yokohama (JP)

(72) Inventor: Akitada Kodama, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 431 days.

(21) Appl. No.: 15/352,287

(22) Filed: Nov. 15, 2016

(65) Prior Publication Data
US 2017/0141093 A1    May 18, 2017

(30) Foreign Application Priority Data
Nov. 16, 2015  (JP) .................. 2015-224197

(51) Int. Cl.
| | |
|---|---|
| *H01L 25/18* | (2006.01) |
| *H01L 21/52* | (2006.01) |
| *H01L 23/057* | (2006.01) |
| *H01L 23/528* | (2006.01) |
| *H01L 23/532* | (2006.01) |
| *H01L 23/66* | (2006.01) |
| *H01L 23/00* | (2006.01) |
| *H01L 25/16* | (2006.01) |

(52) U.S. Cl.
CPC .............. *H01L 25/18* (2013.01); *H01L 21/52* (2013.01); *H01L 23/057* (2013.01); *H01L 23/5283* (2013.01); *H01L 23/5329* (2013.01); *H01L 23/53228* (2013.01); *H01L 23/53247* (2013.01); *H01L 23/66* (2013.01); *H01L 24/46* (2013.01); *H01L 25/16* (2013.01); *H01L 2224/45144* (2013.01); *H01L 2224/48137* (2013.01); *H01L 2924/13051* (2013.01); *H01L 2924/13064* (2013.01); *H01L 2924/13091* (2013.01)

(58) Field of Classification Search
None
See application file for complete search history.

(56) References Cited

U.S. PATENT DOCUMENTS

2009/0154872 A1* 6/2009 Sherrer ................ G02B 6/4248
                                                                385/14

FOREIGN PATENT DOCUMENTS

JP         2002-208660 A      7/2002

\* cited by examiner

*Primary Examiner* — Telly D Green
(74) *Attorney, Agent, or Firm* — Baker Botts L.L.P.; Michael A. Sartori

(57) ABSTRACT

A semiconductor apparatus that comprises a package, an active device, and a passive device is disclosed. The package includes a metal base, a shell, and a lid. The active device is mounted of the metal base. The passive device is soldered on the metal base. The passive device includes an insulating substrate with a rectangular outer shape and a bottom electrode with a plane shape reflecting the rectangular outer shape of the insulating substrate. The insulating substrate is made of material with brittleness greater than that of the metal base. A feature of the invention is that the bottom electrode has cut corners.

17 Claims, 10 Drawing Sheets

SEMICONDUCTOR APPARATUS INSTALLING PASSIVE DEVICE

BACKGROUND OF THE INVENTION

Field of the Invention

The present invention relates to a semiconductor apparatus, in particular, the invention relates to a semiconductor apparatus that installs a passive device with an insulating substrate.

A semiconductor apparatus sometimes installs a passive device operable as a capacitor on a base of a package of the apparatus. The passive device includes an insulating substrate made of dielectric or ferroelectric material and a bottom electrode fixed to the base of the package with solder. A Japanese Patent Application laid open No. JP-2002-208660A has disclosed a technique that reduces stresses caused between the base of the package and the insulating substrate of the passive device.

A process of mounting a device in a package with solder inevitably raises a temperature of the device and the package to that higher than a melting point of the solder and cools the temperature thereof down to a room temperature, which causes stresses between the device and the package due to a difference of thermal expansion co-efficient of two members. The stresses sometimes induce cracks in the insulating substrate of the passive device because the insulating substrate, in particular, dielectric or ferroelectric materials for the insulating substrate are often brittle compared with a metal.

SUMMARY OF THE INVENTION

An aspect of the present invention relates to a semiconductor apparatus that provides a package, an active device, and a passive device. The package includes a metal base, a shell that is primarily made of metal, and a lid. The active device is mounted on the metal base. The passive device, which is soldered on the metal base, includes an insulating substrate, which has a rectangular outer shape, and a bottom electrode soldered to the metal base. A feature of the semiconductor apparatus of the invention is that the bottom electrode of the passive device has a plane shape reflecting the rectangular outer shape of the insulating substrate but corners thereof are cut.

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment of the present invention will be described as referring to accompanying drawings. In the description of the drawings, numerals or symbols same with or similar to each other will refer to elements same with similar to each other without duplicating explanations.

First Embodiment

Figure 1A:
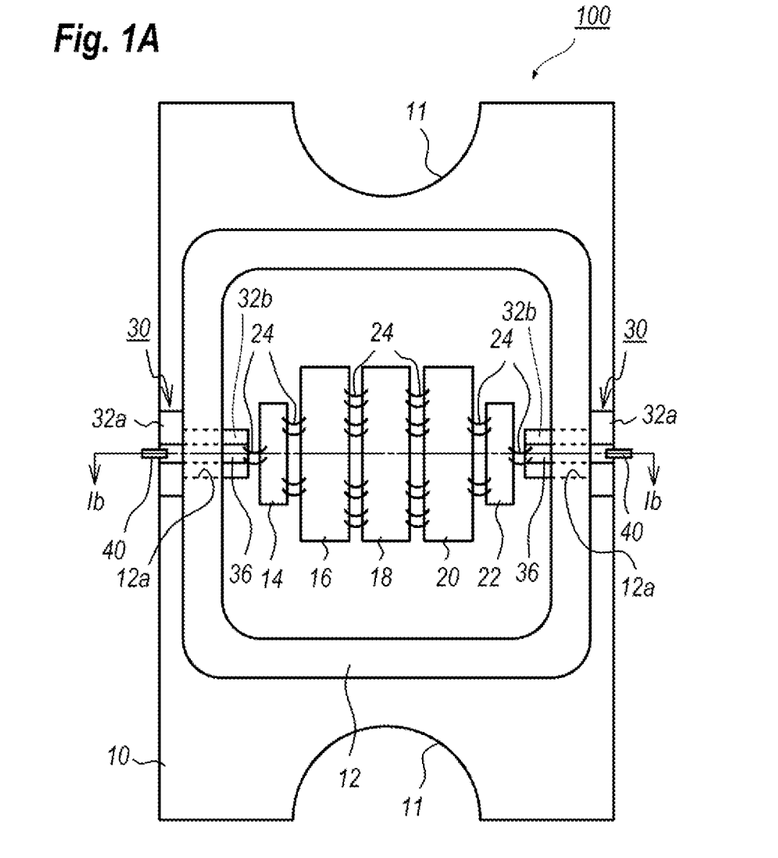
FIG. 1A is a plan view of a semiconductor apparatus.
Figure 1B:
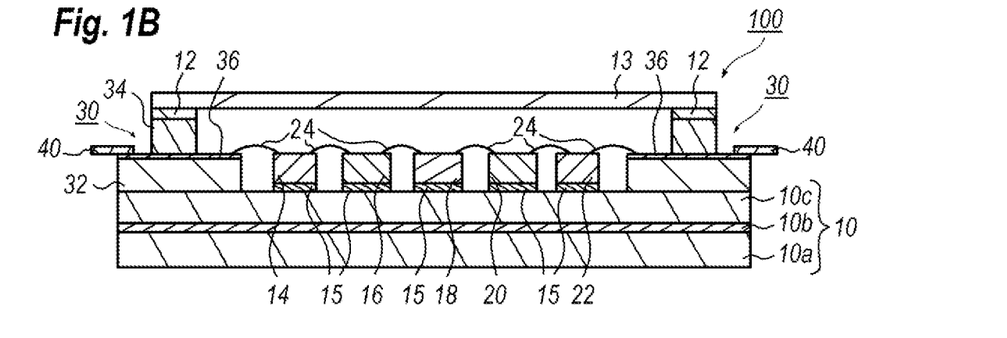
FIG. 1B shows a cross taken along the line Ib-Ib indicated in FIG. 1A.

FIG. 1A is a plan view of a semiconductor apparatus 100 and FIG. 1B shows a cross section of the semiconductor apparatus 100 taken along the line Ib-Ib indicated in FIG. 1A. The semiconductor apparatus 100 includes a base 10, a shell 12, and a lid 13; passive devices, 14, 16, 20, and 22; an active device 18; and two feedthrough terminals 30 in the shell 12. As FIG. 1B shows, the base 10 includes two copper (Cu) layers, 10a and 10c, sandwiching a molybdenum (Mo) layer 10b. The present embodiment provides the base 10 with an arrangement of the multi-layered metals; but the base 10 may provide another arrangement, for instance, a single layered meal of copper tungsten and so on. The base 11 provides a pair of arched cuts 11 through which screws fastens the semiconductor apparatus 100 to a circuit board.

The base 10, the shell 12, a lid 13, and feedthrough terminals 30 constitute a package for enclosing the passive and active devices, 14 to 22, therein. Those passive devices, 14 to 22, are mounted on the base 10, exactly, the top Cu layer 10c of the base, through solder 15 made of, for instance, eutectic alloy of gold and tin (AuSn). The shell 12, which may be made of alloy of iron (Fe), nickel (Ni) and cobalt (Co), which is called as Kovar, has a frame shape hermetically enclosing the active and passive devices, 14 to 22, therein accompanied with the base 10 and the lid 13.

The shell 12 in respective walls facing to each other provides openings 12a into which the feedthrough terminals 30 are inserted. The feedthrough terminals 30 each includes a lower insulator 32, an upper insulator 34, and an interconnection 36 on the lower insulator 32. The lower insulator 32 provides an outer portion 32a outside of the shell 12 and an inner portion 32b beneath the shell 12 and an inside thereof, where the outer portion 32a has a lateral width wider than the inner portion 32b; that is, the lower insulator 32 has a T-shaped plan view. The lower insulator 32 forms the interconnection 36 thereon, where the interconnection 36 extends along a longitudinal direction of the lower insulator 32 from the outer portion 32a to the inner port 32b. The interconnection 32 may be made of gold (Au). The interconnection 36 is connected to a lead terminal 40 made of copper (Cu) or Kovar plated with gold (Au). Provided between the lower insulator 32 and the base 10 is a brazed metal, and provided between the upper insulator 34 and the shell 12 is also a brazed metal. That is, the lower insulator 32 is mounted on the base 10 interposing with the brazed metal. Gaps between the upper insulator 36 and the opening 12a of the shell 12 are filled with another brazed metal.

Bonding wires 24 electrically connect the interconnection 36 on the lower insulator 32 of the feedthrough terminal 30 to the passive device 14, between the passive devices, 14 and 16, the passive device 16 to the active device 18, the active device to the passive device 20, between the passive devices, 20 and 22, and the passive device 22 to the interconnection 36 on the lower insulator 32 of the feedthrough terminal 30. The bonding wires 24 may be made of gold (Au).

The active device 18 provides a substrate and semiconductor layers formed on the substrate. The semiconductor layers, which may be primarily made of nitride semiconductor materials, form a field effect transistor (FET) such as high electron-mobility transistor (HEMT). The substrate may be made of silicon carbide (SiC). The passive devices, 14 and 22, may include transmission lines, while, other passive devices, 16 and 20, may include capacitors.

One of feedthrough terminals 30 inputs an radio frequency (RF) signal to the interconnection 36, while, another feedthrough terminal 30 outputs an amplified RF signal. The feedthrough terminals 30 also provide biases to the active device 18. The passive devices, 14 and 16, match the impedance between the input feedthrough terminal 30 and the active device 18, while, other passive devices, 20 and 22, matches the impedance between the active device 18 and the output feedthrough terminal 30 at frequencies of the RF signal subject to the semiconductor apparatus 100.

Figure 2A:
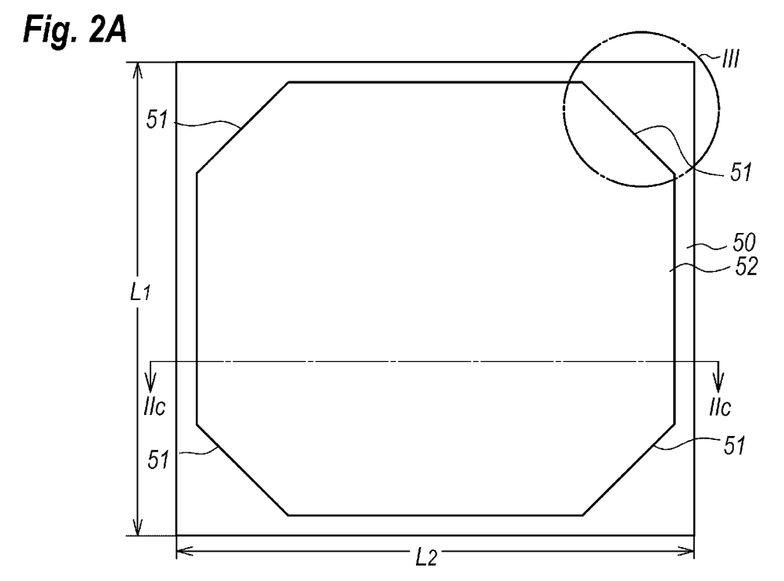
FIG. 2A is a bottom view of the passive device facing the base.
Figure 2B:
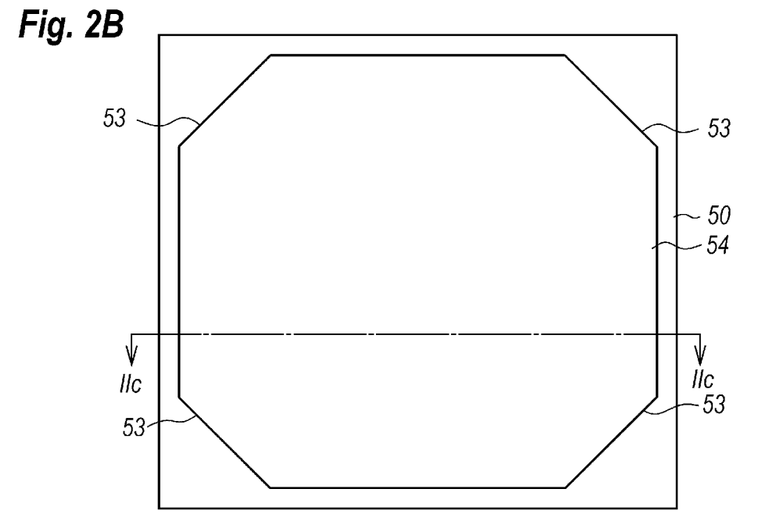
FIG. 2B is a top view of the passive device.
Figure 2C:
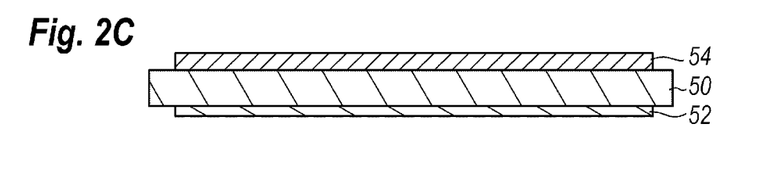
FIG. 2C shows a cross section taken along the line IIc-IIc indicated in FIGS. 2A and 2B.
Figure 3:
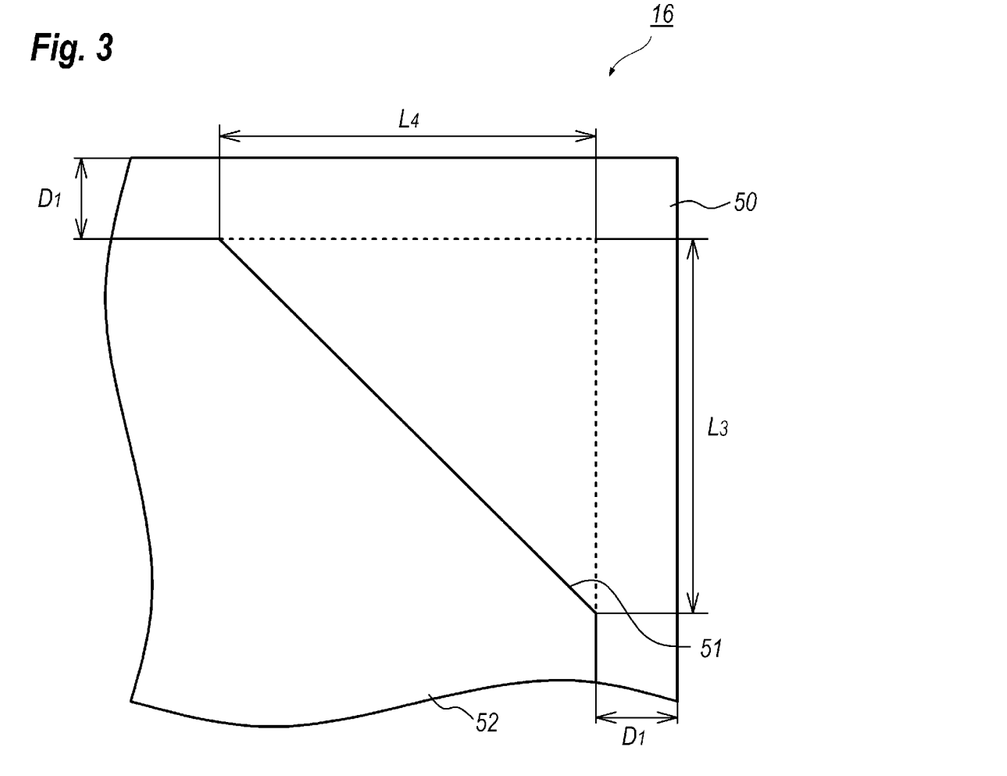
FIG. 3 magnifies a corner portion III of the bottom view which is circled in FIG. 2A.

FIG. 2A is a bottom view of the passive device 16 facing the base 10, FIG. 2B is a top view of the passive device 16, and FIG. 2C shows a cross section thereof taken along the line IIc-IIc indicated in FIGS. 2A and 2B. FIG. 3 magnifies a corner portion III of the bottom view circled in FIG. 2A. The passive device 20 has an arrangement same with those of the passive device 16 shown in FIGS. 2A to 2C. Other two passive devices, 14 and 22, in details thereof will be described later in this specification.

The passive device 16 provides an insulating substrate 50, a bottom electrode 52 in a bottom surface of the insulating substrate 50, and a top electrode 54 in a top surface of the insulating substrate 50. The insulating substrate 50, and the top and the bottom electrodes, 52 and 54, constitute a parallel plate capacitor. The passive device 16 is mounted on the base 10 by the solder 15 between the bottom electrode 52 and the base 10. The bottom electrode 52 is grounded through the base 10, while, the top electrode 54 is connected to the active device 18 and another passive device 14 through the bonding wires 24. The insulating substrate 50 may be dielectric material, in particular, ferroelectric material, such as barium titanium oxide ($BaTiO_3$), with a thickness of around 0.2 mm, exactly 0.2±0.01 mm and a rectangular plane shape when the passive device 16 forms a capacitor. The insulating substrate 50 has a longitudinal length $L_1$ less than 2.5 mm and a lateral length $L_2$ less than 3.5 mm.

The bottom electrode 52 and the top electrode 54 has a plane shape reflecting the rectangular outer shape of the insulating substrate 50 but respective corners are cut so as to form diagonal lines 51. Referring to FIG. 3, cut lengths, $L_3$ and $L_4$, along the lateral and longitudinal directions are preferably 0.05 to 0.1 mm, and retreated distances $D_1$ from the lateral and longitudinal edges of the insulating substrate 50 are each shorter than 0.1 mm. The upper electrode 54 preferably has a plane shape same with that of the bottom electrode 52 and preferably projects the position of the bottom electrode 52. That is, the top electrode 54 also provides the cut corners 53 so as to form a plane shape of an octagon. The top and bottom electrodes are preferably made of gold (Au), but the top electrode 54 has a thickness of 4 µm while the bottom electrode 52 has a thickness of 2 µm, namely, almost a half of that of the top electrode.

Figure 4A:
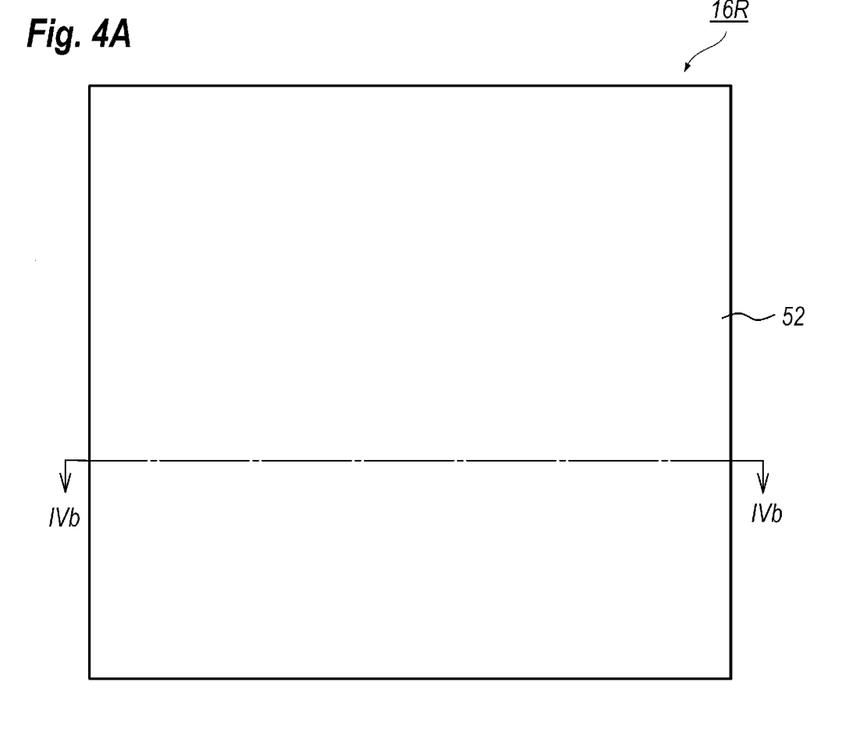
FIG. 4A is a bottom plan view of a passive device of the comparable example.
Figure 4B:
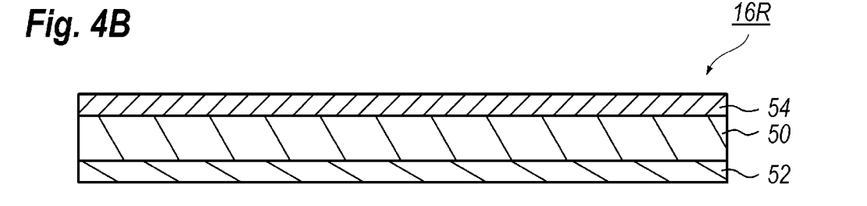
FIG. 4B shows a cross section of the comparable passive device which is taken along the line IVb-IVb indicated in FIG. 4A.

Next, an example that is comparable to the present embodiment will be described. FIG. 4A is a bottom plan view of a passive device 16R of the comparable example, and FIG. 4B shows a cross section taken along the line IVb-IVb indicated in FIG. 4A. The bottom electrode 52 has a plane shape fully tracing outer dimensions of the insulating substrate 50; that is, the bottom electrode 52 completely covers the bottom surface of the insulating substrate 50, while, the top electrode 54 also completely covers the top surface of the insulating substrate 50. The bottom and top electrodes, 52 and 54, have no corner cuts.

The passive devices, 14 to 22 and 16R, are mounted on the base 10 with the solder 15 that may be an eutectic alloy of gold tin (AuSn) with a Sn composition of 22%. A process of mounting the passive devices, 14 to 22 and 16R, raises a temperature of the base 10 and the passive devices to a temperature higher than a melting point of the solder 15, which is for instance 320° C. for AuSn eutectic alloy, and cools the temperature thereof down to a room temperature to solidify the solder 15. Thus, the mounting by the solder 15 generally requires a temperature higher than a temperature under which the passive devices are fixed on the base 10 by resin. Because the base 10 of the embodiment has the arrangement of two copper layers, 10a and 10c, sandwiching the molybdenum layer 10b; the base 10 has a thermal expansion coefficient substantially equal to that of copper (Cu), namely, $16.7 \times 10^{-6}$/K. On the other hand, the insulating substrate 50 has a thermal expansion coefficient of $34.0 \times 10^{-6}$/K for $BaTiO_3$, which is almost twice of that of the copper (Cu). Thus, because of a difference in the thermal expansion co-efficient of Cu and $BaTiO_3$, $BaTiO_3$ of the insulating substrate 50 further shrinks compared with Cu of the base 10 as cooling the temperature down to the room temperature, which causes a stress in the insulating substrate 50 so as to detach corners thereof from the base 10. Moreover, $BaTiO_3$ and other dielectric or ferroelectric materials are generally brittleness higher than a metal or copper (Cu) of the base 10. That is, the insulating substrate 50 is fragile compared with a metal. Thus, the insulating substrate 50 easily induces or causes cracks. The bottom electrode 52 with the cut corners 51 may suppress the stress concentrating on the corners, accordingly the cracks occurring primarily in the corners thereof.

As FIGS. 2A and 2B illustrate, the top electrode 54 has the plane shape substantially equal to that of the bottom electrode 52. Moreover, the top electrode 54 substantially projects the position of the bottom electrode 52. Accordingly, a parallel plate capacitor having designed capacitance may be formed by an arrangement of the top and bottom electrodes, 52 and 54, sandwiching the insulating substrate 50. The top electrode 54 may have the plane shape substantially equal to that of the bottom electrode 52 within a tolerance of process stability.

The corners of the electrodes, 52 and 54, are preferably cut by a length of 0.05 to 0.1 mm. Cut lengths shorter than 0.05 mm may show restricted function of dispersing the stress concentration. On the other hand, cut lengths longer than 0.1 mm results in restricted capacitance because areas of the top and bottom electrodes, 52 and 54, are narrowed. Cut lengths of 0.05 to 0.1 mm may make the dispersion of the stress consistent with securing the designed capacitance. The cut lengths, $L_3$ and $L_4$, are unnecessary to be equal to each other.

A widened retreated distance D1 may also suppress the stresses concentration on the corners of the insulating substrate 50. For instance, when the retreated distance D1 becomes wider than 0.2 mm, the stress concentration on the corners of the insulating substrate 50 may be dispersed to cause substantially no cracks thereon. However, such a widened distance D1 inevitably narrows the area of the electrodes, 52 and 54, which results in a restricted capacitance. Accordingly, the retreated distance D1 may be shorter than 0.1 mm in the bottom and top electrodes, 52 and 54.

The top electrode 54 may have a thickness of around 4 μm, which is thicker than that (2 μm in the present embodiment) of the bottom electrode 52. Because the bottom electrode 52 is to be alloyed with the solder 15, the bottom electrode 52 is hard to be formed in thick. Accordingly, the bottom electrode 52 preferably has a thickness of around 2 μm, which is thinner than that of the top electrode 54, namely, almost half of that of the top electrode 54.

In order to increase capacitance for a unit area of the electrodes, the insulating substrate 50 may be made of dielectric material, or ferroelectric material such as $BaTiO_3$ of the present embodiment. Dielectric materials and/or ferroelectric materials are generally fragile compared with metals, which easily causes cracks due to the stresses. The base 10, because of the arrangement of two copper layers sandwiching a molybdenum layer, shows the thermal expansion co-efficient substantially equal of that of a copper mono layer, which is given by $16.7 \times 10^{-6}$ /K. The $BaTiO_3$ has the thermal expansion co-efficient of $34.0 \times 10^{-6}$ /K, almost twice of that of the base 10. Thus, the large difference in the thermal expansion co-efficient may easily induce large stresses by a temperature change. The cut corners of the bottom electrode 52 may effectively suppress the stresses to be concentrated on the corners of the insulating substrate 50, which prevents the cracks causes in the stressed insulating substrate 50. Because the cut corners effectively prevent the stress to be concentrated on the corners, the insulating substrate 50 may be made of widely selected material except for $BaTiO_3$.

The bottom and top electrodes, 52 and 54, of the embodiment may be made of stacked metal of titanium (Ti), palladium (Pd), and gold (Au) from the side of the insulating substrate 50. The bottom and top electrodes, 52 and 54, may further provide a plated gold (Au) on the topmost gold (Au). Also, the base 10 may provide other arrangement except for dual copper layers (Cu) sandwiching the molybdenum layer (Mo). The topmost layer of the base 10 is preferably copper (Cu). The solder 15 may be other alloys except for the eutectic alloy of AuSn. For instance, silver (Ag) solder may be applicable to bond the passive and active devices, 14 to 22, on the base 10.

Figure 5A:
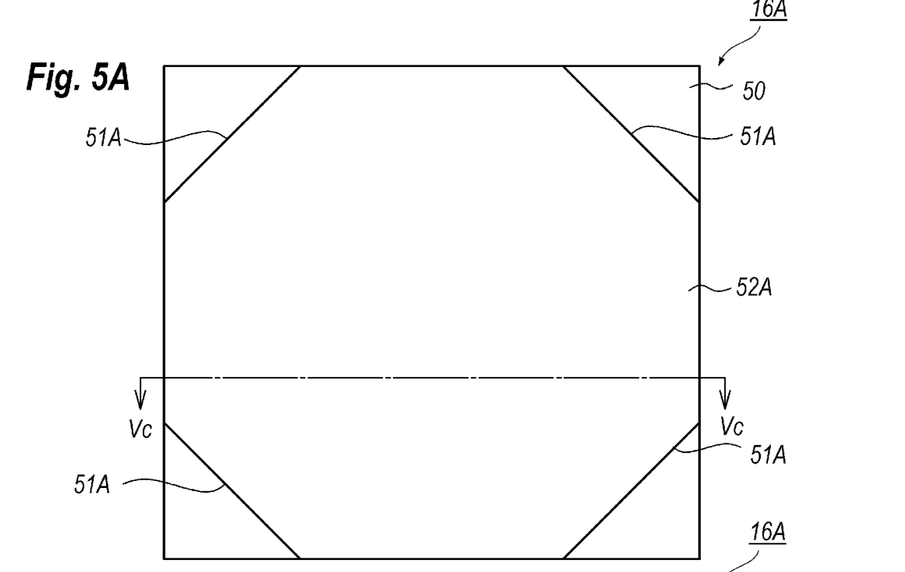
FIGS. 5A and 5B are a bottom plan view and a top plan view of a passive device, respectively, which is modified from the passive device of the first embodiment.
Figure 5B:
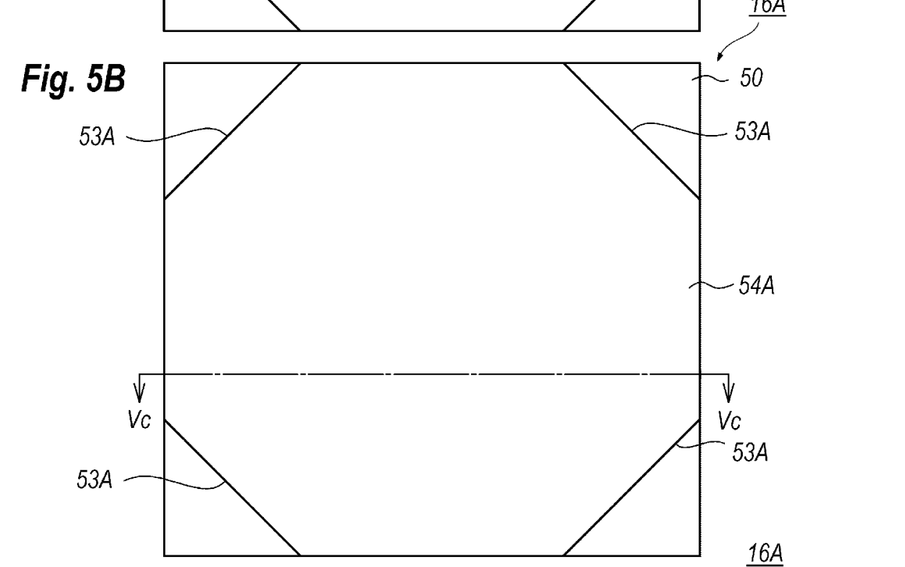
Figure 5C:
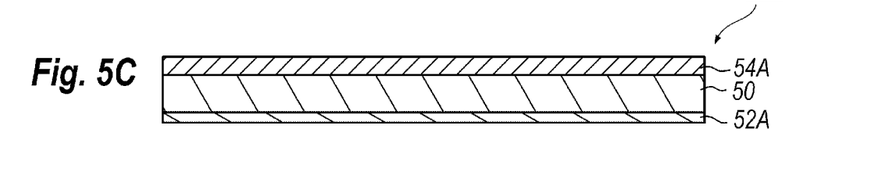
FIG. 5C shows a cross section of the modified passive device taken along the line Vc-Vc indicated in FIGS. 5A and 5B.

FIGS. 5A and 5B are a bottom plan view and a top plan view of a passive device 16A, respectively, where the passive device 16A is modified from the passive device 16 of the first embodiment, and FIG. 5C shows a cross section thereof taken along the line Vc-Vc indicated in FIGS. 5A and 5B. The passive device 16A, in particular, the bottom and top electrodes, 52A and 54A, thereof, have a feature distinguishable from the electrodes, 52 and 54, of the first embodiment that the bottom and top electrodes, 52A and 54A, of the present embodiment extend to respective edges of the insulating substrate 50 without securing the retreated distances D1. Because the modified passive device 16A of the embodiment has the widened areas of the bottom and top electrodes, 52A and 54A; the passive device 16A may have the capacitance increased from that of the aforementioned passive device 16 shown in FIGS. 2A to 3. The bottom and top electrodes, 52A and 54A, still have the cut corners, 51A and 53A, extending to the respective edges of the insulating substrate 50. Accordingly, the passive device 16A may suppress the cracks in the insulating substrate 50.

Second Embodiment

Figure 6A:
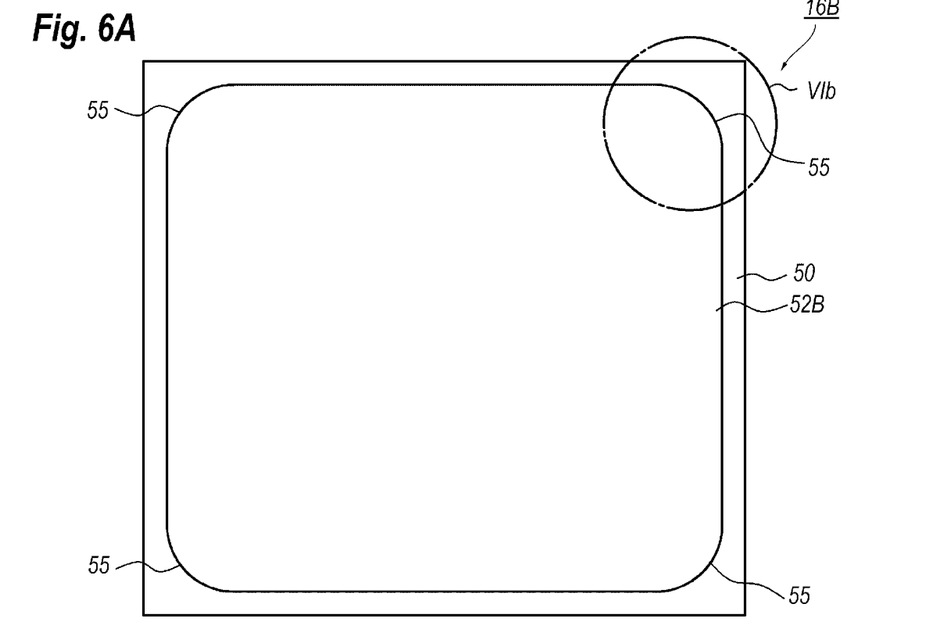
FIG. 6A is a bottom plan view of the passive device according to the second embodiment of the present invention, and FIG. 6B magnifies a corner portion VIb of the bottom electrode which is circled in FIG. 6A.
Figure 6B:
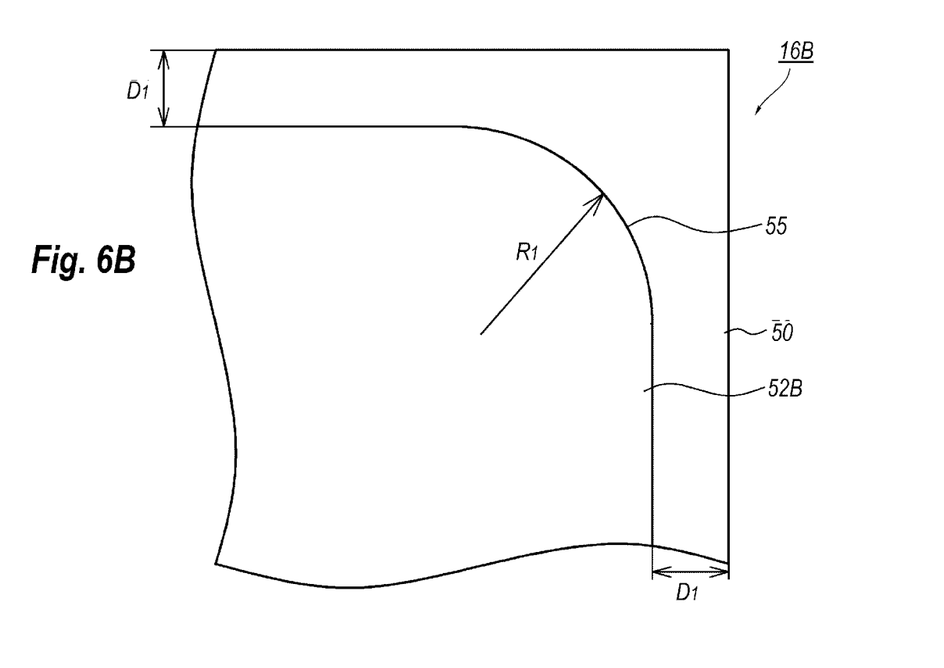

FIG. 6A is a bottom plan view of the passive device 16B according to the second embodiment of the present invention, and FIG. 6B magnifies a corner portion VIb of the bottom electrode 52B circled in FIG. 6A.

The bottom electrode 52B of the present embodiment provides corners 55 cut in curved protruding outwardly. The curved corners 55 have a radius $R_1$ of, for instance 0.5 mm. The passive device 16B of the embodiment also provides the retreated distances D1 between edges of the insulating substrate 50 and those of the bottom electrode 52B, which is shorter than 0.1 mm same as that of the first embodiment. Although not shown in the figures, the top electrode of the passive device 16B of the present embodiment has the shape substantially same with that of the bottom electrode 52B, that is, the top electrode also provides the curved corners, and the position projecting the bottom electrode 52B.

Third Embodiment

Figure 7:
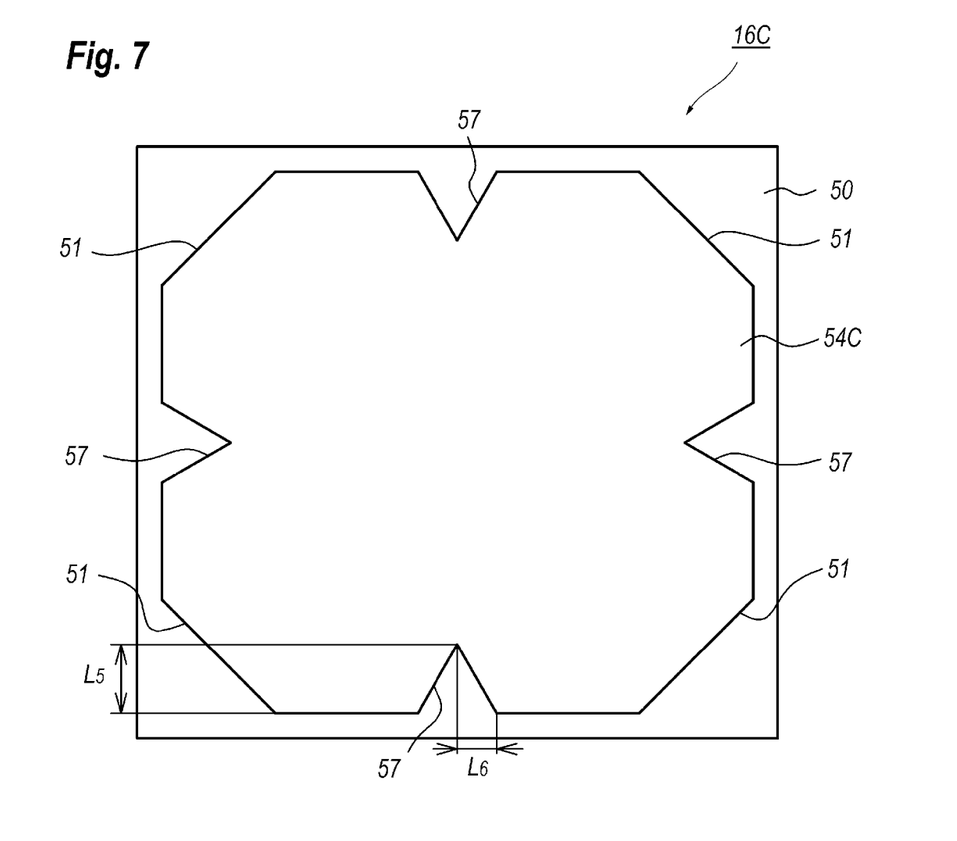
FIG. 7 is a bottom plan view of another passive device according to the third embodiment of the present invention.

FIG. 7 is a bottom plan view of another passive device 16C according to the third embodiment of the present invention. The passive device 16C, in particular, the bottom electrode 52C thereof has a feature that respective edges thereof provide V-shaped cuts with a depth $L_5$ of around 2 μm while, a half width of around 3 μm. The bottom electrode 52C also provides cut corners 51 with dimensions thereof same with those of the first embodiment shown in FIG. 2. The difference in the thermal expansion co-efficient between the insulating substrate 50 and the base 10 causes stresses concentrating not only respective corners of the insulating substrate 50 but also centers of the respective edges. The V-shaped cuts 57 in the centers of the respective edges may effectively disperse the stress to be concentrated thereon. The arrangement of the bottom electrode 52C shown in FIG. 7 may further prevent the stresses caused in the insulating substrate 50. Although not illustrated in the figures, the top electrode of the passive device 16C may have the shape substantially same with that of the bottom electrode 52C.

The V-shaped cuts 57 may be formed offset from the centers of the respective edges. However, in order to disperse the stresses to be concentrated thereon, the V-shaped cuts 57 are preferably positioned in the centers of the edges. Also, the respective edges are unnecessary to provide the V-shaped cuts 57. Only two edges opposite to each other may provide the V-shaped cuts 57. Also, the edges may provide two or more V-shaped cuts 57. The V-shaped cuts 57 in the centers of the respective edges may combine with the curved corners 55 shown in FIG. 6A. The respective edges providing the V-shaped cuts 57 may extend to the edges of the insulating substrate 50; that is, the bottom electrode 52C may leave no retreated distances D1 against the edges of the insulating substrate 50.

Fourth Embodiment

Figure 8A:
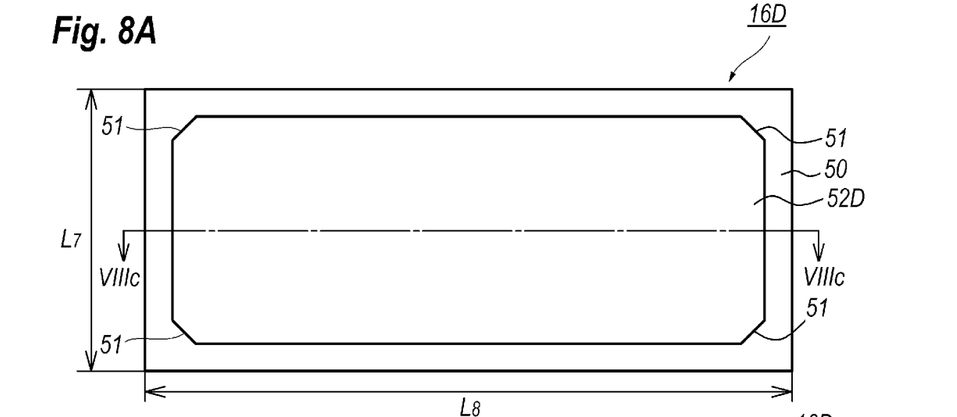
FIG. 8A is a bottom plan view of another passive device according to the fourth embodiment of the present invention.
Figure 8B:
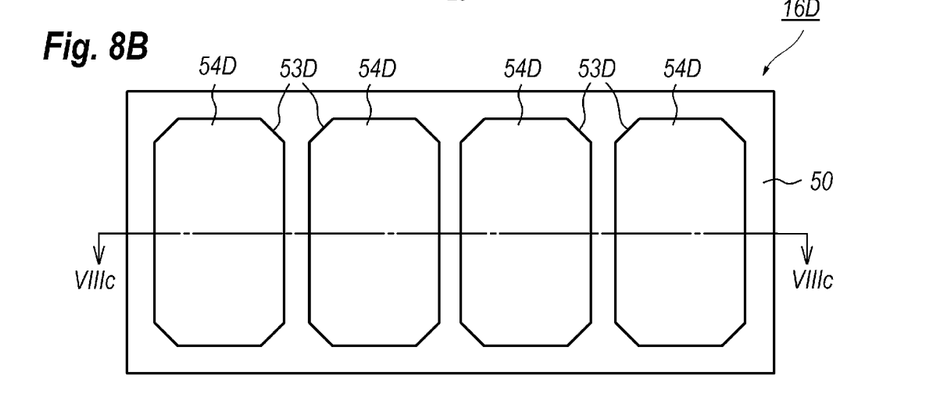
FIG. 8B is a top plan view thereof.
Figure 8C:
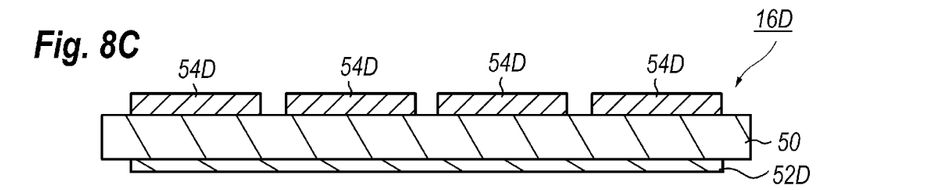
FIG. 8C shows a cross section thereof taken along the line VIIIc-VIIIc indicated in FIGS. 8A and 8B.

FIG. 8A is a bottom plan view of another passive device 16D according to the fourth embodiment of the present invention, FIG. 8B is a top plan view thereof, and FIG. 8C shows a cross section thereof taken along the line VIIIc-VIIIc indicated in FIGS. 8A and 8B. The passive device 16D has a feature distinguishable from those of the aforementioned embodiment in that the top electrode 54D thereof is divided in four (4) parts and the bottom electrode 52D has a laterally extended rectangular shape with a longitudinal length shorter than 2.5 mm and a lateral length shorter than 3.5 mm. The bottom electrode 52D also provides the cut corners 51.

The top electrode of the passive device 16D is divided into four (4) parts 54D each having cut corners 53D. The divided four electrodes 54D are each to be coupled with the bonding wires 24. The passive device 16D may suppress the stresses to be concentrated on the respective corners in the insulating substrate 50 by the cut corners 51 in the bottom electrode 52D and the retreated distances against the respective edges of the insulating substrate 50. Although the top electrode 54D is divided into four parts, the top electrodes 54D may be divided into two, three, and more than four parts.

Fifth Embodiment

Figures 9A, 9B:
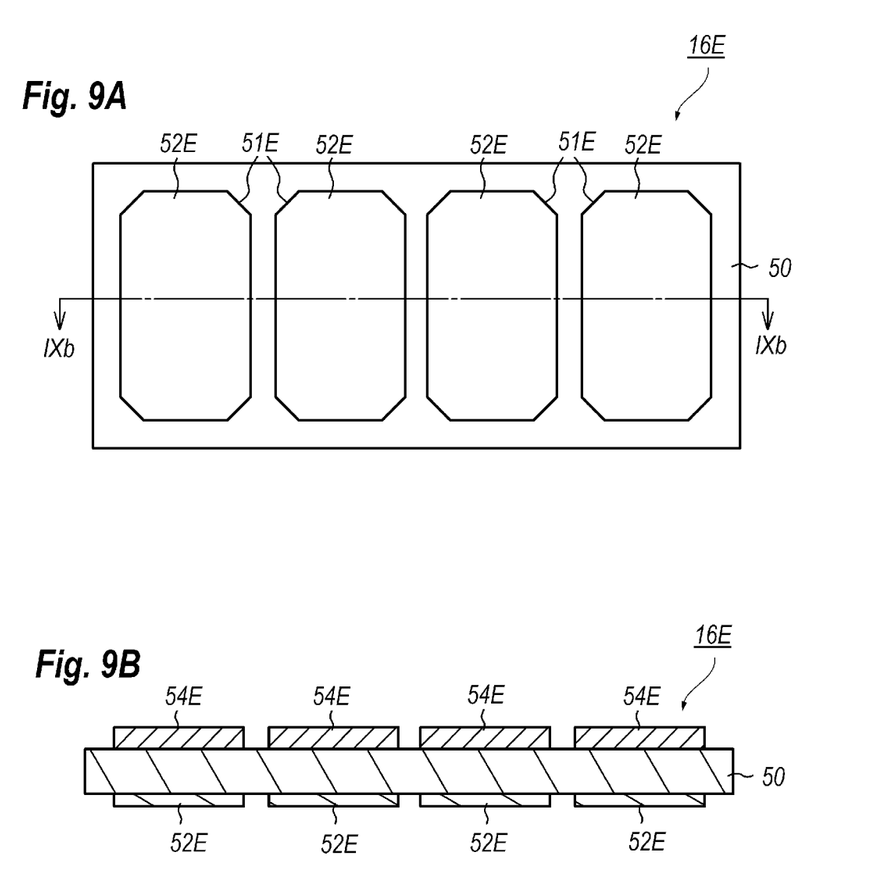
FIG. 9A is a bottom plan view of another passive device according to the fifth embodiment of the present invention.
FIG. 9B shows a cross section thereof taken along the line IXb-IXb indicated in FIG. 9A.

FIG. 9A is a bottom plan view of another passive device 16E according to the fifth embodiment of the present invention, and FIG. 9C shows a cross section thereof taken along the line IXb-IXb indicated in FIG. 9A. The passive device 16E has a feature that not only the top electrode 54E thereof but also the bottom electrode 52E thereof are divided in four (4) parts. Divided top electrodes 54E each has a shape substantially same with those of the respective divided bottom electrodes 52E and the positions thereof project the respective bottom electrodes 52E.

The respective bottom electrodes 52E of the present embodiment also provide the cut corners 51E that effectively suppresses the stresses caused in the insulating substrate 50 from concentrating on the corners. The cut corners 51E may be replaced to the curved corners shown in FIG. 6A. Also, the respective edges of the bottom electrodes 52E may provide the V-shaped cuts shown in FIG. 7. The division of the electrodes, 52E and 54E, is not restricted to four (4). The electrodes, 52E and 54E, may be divided into two, three, or more than four parts.

Figure 10A:
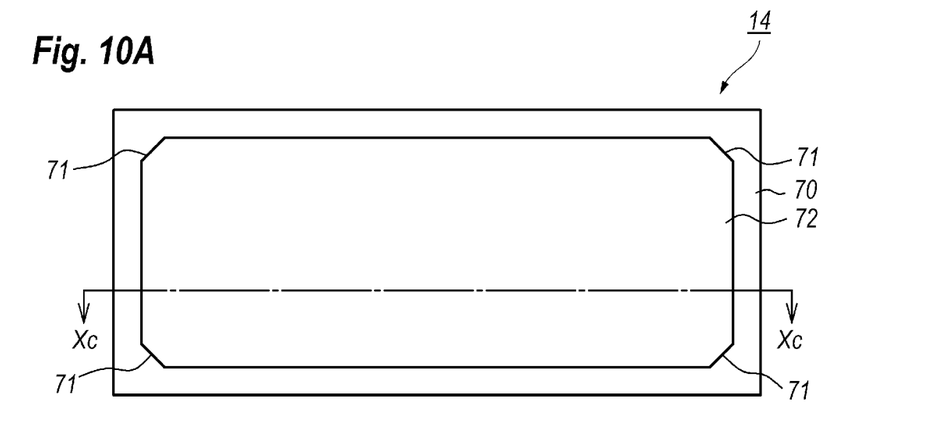
FIG. 10A is a bottom plan view and FIG. 10B is a top plan view of the other passive device shown in FIGS. 1A and 1B.
Figure 10B:
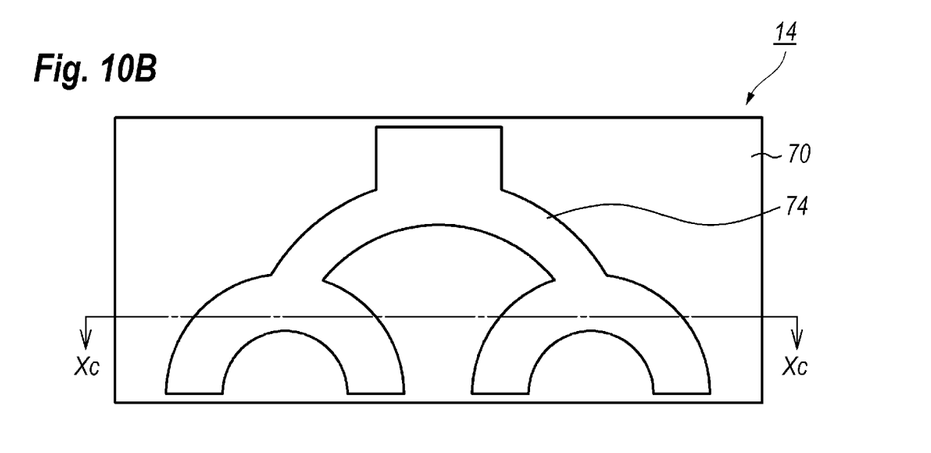
Figure 10C:
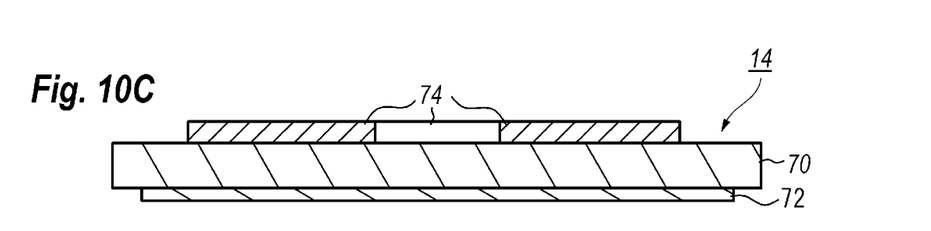
FIG. 10C shows a cross section thereof taken along the line Xc-Xc indicated in FIGS. 10A and 10B.

Next, another passive device 14 that mounts the transmission line thereon will be described in detail. FIG. 10A is a bottom plan view and FIG. 10B is a top plan view of the passive device 14 shown in FIGS. 1A and 1B. FIG. 10C shows a cross section of the passive device 14 taken along the line Xc-Xc indicated in FIGS. 10A and 10B. The output passive device 22 has an arrangement substantially with the input passive device 14 shown in FIGS. 10A to 10C.

The passive device 14 provides an insulating substrate 70, a bottom electrode 72 on a bottom surface thereof and interconnections 74 on a top surface thereof. This arrangement of the passive device 14 forms a micro-strip line for transmitting an RF signal thereon when the bottom electrode 72 is grounded. The insulating substrate 70 may be made of aluminum oxide ($Al_2O_3$) with a thickness of about 0.2 mm. The bottom electrode 72 and the top interconnection 74 may be made of primarily gold (Au). The bottom electrode 72 is to be fixed on the base 10 by the solder 15, while, the top interconnection 74 is to be wire-boned with the bonding wires 24 as shown in FIG. 1B to divide or combine the RF signal. The bottom electrode 72 provides the cut corners 71 as those of the aforementioned embodiment, which effectively suppress the stresses to be concentrated on the corners and prevent the insulating substrate 70 from causing cracks.

The cut corners 71 may be replaced to the curved corners shown in FIG. 6A. Also, the bottom electrodes 72 may provide the V-shaped cut shown in FIG. 7 in at least two edges opposite to each other.

The semiconductor apparatus 100 may implement the passive devices, 16D or 16E, and the other passive devices, 14 and 22, accompanied with the active device 18. In such an arrangement, the passive device 14 in the interconnection 74 in an assembled end thereof is coupled with the feedthrough terminal 30 through the bonding wires 24, while, distributed ends thereof are coupled with the respective top electrodes, 54D or 54E, through the bonding wires 24. Also, the top electrodes, 54D or 54E, of the passive device, 16D or 16E, are coupled with the active device 18 through bonding wires 24 and respective bottom electrodes, 52D, 52E, and 72, are grounded to the base 10 by the solder 15. Thus, the passive devices, 14 and 16, in the input side and the passive devices, 20 and 22, in the output side may operate as impedance matching circuits between the feedthrough terminals 30 and the active device 18.

During the process of producing the semiconductor apparatus 100, three times of heat treatment raising the temperature of the base 10 to, for instance 320° C., which is higher than the melting point of the solder 15; that is, the mounting of the passive devices, 14 and 22, on the base 10; the mounting of the other passive devices, 16 and 20, on the base 10; and the mounting of the active device 18 on the base 10. Because the passive devices, 14 and 22, have the insulating substrate 70 made of aluminum oxide ($Al_2O_3$), the passive devices, 14 and 22, may show considerable heat resistivity. On the other hand, the other passive devices, 16 and 20, have the insulating substrate 50 made of, for instance, barium titanium oxide ($BaTiO_3$) that shows inferior heat resistivity compared with $Al_2O_3$. Also, the active device 18 shows further lesser heat resistivity compared with $BaTiO_3$. Accordingly, the passive devices, 14 and 22, are first assembled on the base 10, then, the other passive devices, 16 and 20, are mounted; and finally, the active device 18 is to be mounted on the base 10. Thus, the passive devices, 14 and 22, having the insulating substrate of aluminum oxide ($Al_2O_3$) pass the thermal process three times, the other passive devices, 16 and 20, pass the thermal process twice, and the active device 18 experiences the thermal process only once, which effectively enhances the reliability of the active device 18.

The embodiment of the present invention provides the passive devices, 16 and 20, of the type of the capacitor with the dielectric material of $BaTiO_3$. But the capacitor of the passive devices, 16 and 20, may provide $Al_2O_3$ as a dielectric material sandwiched by the metal layers. Also, the passive devices, 14 to 22, may include, in addition to the capacitor and the transmission line, inductors thereon.

The active device 18 may include the substrate and semiconductor layers grown on the substrate. The substrate may be made of silicon carbide (SiC), silicon (Si), sapphire ($Al_2O_3$), gallium nitride (GaN) and so on. The semiconductor layers may be made of nitride semiconductor materials such as GaN, aluminum gallium nitride (AlGaN), indium gallium nitride (InGaN), indium nitride (InN), aluminum indium gallium nitride (AlInGaN), and so on. The active device 18 may be made of gallium arsenide (GaAs) and related semiconductor materials whose lattice constants substantially equal to that of GaAs. In such an active device, the substrate may be made of GaAs. Those active devices have a type of the field effect transistor (FET), the hetero-bipolar transistor (HBT) and so on.

Although the semiconductor apparatus 100 of the embodiment installs five devices, namely, four passive devices, 14 to 22, and one active device 18; the semiconductor apparatus 100 may install only one or two devices, or more than five devices. Even in such an arrangement of the semiconductor apparatus 100, the devices may provide the bottom electrode with the cut corners, or the curved corners.

In the foregoing detailed description, the apparatus of the present invention have been described with reference to specific exemplary examples thereof. However, it will be evident that various modifications and changes may be made thereto without departing from the broader spirit and scope of the present invention. The present specification and figures are accordingly to be regarded as illustrative rather than restrictive.

The present application claims the benefit of priority of Japanese Patent Application No. 2015-224197, filed on Nov. 16, 2015, which is incorporated herein by reference.

I claim:

1. A semiconductor apparatus, comprising:
a package including a metal base, a shell primarily made of metal, and a lid;
an active device mounted on the metal base; and
a passive device soldered on the metal base, the passive device including an insulating substrate with a rectangular outer shape and a bottom electrode soldered to the metal base, the insulating substrate being made of material having brittleness greater than the metal base,
wherein the bottom electrode of the passive device has a plane shape reflecting the rectangular outer shape of the insulating substrate but corners thereof are cut.

2. The semiconductor apparatus of claim 1,
wherein the corners of the bottom electrode are diagonally cut.

3. The semiconductor apparatus of claim 2,
wherein the bottom electrode has a cut length of 0.05 to 0.1 mm in the respective corners.

4. The semiconductor apparatus of claim 1,
wherein the corners of the bottom electrode are cut in curved protruding outwardly.

5. The semiconductor apparatus of claim 1,
wherein the bottom electrode has a plane shape retreated from the rectangular outer shape of the insulating substrate.

6. The semiconductor apparatus of claim 5,
wherein the bottom electrode is retreated from the rectangular outer shape of the insulating substrate by a length shorter than 0.1 mm.

7. The semiconductor apparatus of claim 1,
wherein the bottom electrode has a plane shape substantially aligned with the rectangular outer shape of the insulating substrate except for the corners thereof.

8. The semiconductor apparatus of claim 1,
wherein the bottom electrode further provides V-shaped cuts in edges thereof opposite to each other.

9. The semiconductor apparatus of claim 1,
wherein the base has an arrangement of two cupper layers sandwiching a molybdenum layer.

10. The semiconductor apparatus of claim 1,
wherein the insulating substrate is made of barium titanium oxide ($BaTiO_3$) with a thickness of 0.2±0.01 mm.

11. The semiconductor apparatus of claim 1,
wherein the passive device is soldered to the base by a eutectic alloy.

12. The semiconductor apparatus of claim 11,
wherein the eutectic alloy is gold tin (AuSn) with a Sn composition of 22%.

13. The semiconductor apparatus of claim 1,
wherein the passive device further includes a top electrode with a plane shape substantially equal to a plane shape of the bottom electrode and a position reflecting the bottom electrode, and
wherein the top electrode, the insulating substrate, and the bottom electrode constitute a parallel-plate capacitor.

14. The semiconductor apparatus of claim 13,
wherein the top electrode is divided in two or more portions.

15. The semiconductor apparatus of claim 14,
wherein the bottom electrode is divided in two or more portions each having a plane shape with diagonally cut corners and substantially equal to a plane shape of each of the divided top electrode.

16. The semiconductor apparatus of clam 13,
wherein the top electrode and the bottom electrode are made of primarily gold (Au), and
wherein the top electrode has a thickness greater than a thickness of the bottom electrode.

17. The semiconductor apparatus of claim 1,
wherein the insulating substrate has the rectangular outer shape with longitudinal edges shorter than 2.5 mm and lateral edges shorter than 3.5 mm.

* * * * *